(12) United States Patent
Liu et al.

(10) Patent No.: US 12,300,319 B2
(45) Date of Patent: May 13, 2025

(54) 3D NAND FLASH AND OPERATION METHOD THEREOF

(71) Applicant: YANGTZE MEMORY TECHNOLOGIES CO., LTD., Wuhan (CN)

(72) Inventors: Hongtao Liu, Wuhan (CN); Song Min Jiang, Wuhan (CN); Dejia Huang, Wuhan (CN); Ying Huang, Wuhan (CN); Wenzhe Wei, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/211,163

(22) Filed: Jun. 16, 2023

(65) Prior Publication Data

US 2023/0335194 A1 Oct. 19, 2023

Related U.S. Application Data

(63) Continuation of application No. 17/751,432, filed on May 23, 2022, now Pat. No. 11,727,990, which is a continuation of application No. 17/199,411, filed on Mar. 11, 2021, now Pat. No. 11,342,023, which is a continuation of application No. 16/907,299, filed on Jun. 21, 2020, now Pat. No. 10,978,153, which is a continuation of application No. PCT/CN2020/090997, filed on May 19, 2020.

(51) Int. Cl.
| | | |
|---|---|---|
| *G11C 16/04* | (2006.01) | |
| *G11C 16/08* | (2006.01) | |
| *G11C 16/10* | (2006.01) | |
| *G11C 16/14* | (2006.01) | |
| *G11C 16/26* | (2006.01) | |
| *G11C 16/34* | (2006.01) | |

(52) U.S. Cl.
CPC .......... *G11C 16/0483* (2013.01); *G11C 16/08* (2013.01); *G11C 16/10* (2013.01); *G11C 16/14* (2013.01); *G11C 16/26* (2013.01); *G11C 16/3459* (2013.01)

(58) Field of Classification Search
CPC ..... G11C 16/0483; G11C 16/08; G11C 16/26; G11C 16/10; G11C 16/14; G11C 16/3459
USPC ........................................ 365/185.17, 185.24
See application file for complete search history.

(56) References Cited

U.S. PATENT DOCUMENTS

| | | |
|---|---|---|
| 9,070,446 B1 | 6/2015 | Aritome |
| 9,142,298 B2 | 9/2015 | Dong et al. |

(Continued)

FOREIGN PATENT DOCUMENTS

| | | |
|---|---|---|
| CN | 109065091 A | 12/2018 |
| CN | 110678926 A | 1/2020 |
| WO | 2019/226223 A1 | 11/2019 |

*Primary Examiner* — Michael T Tran
(74) *Attorney, Agent, or Firm* — BAYES PLLC (57) ABSTRACT

A memory includes wordline (WL) layers and a controller coupled to the WL layers. The controller is configured to apply at least one verify voltage to a first WL layer of the WL layers during a verify phase, and apply a first pass voltage to a second WL layer of the WL layers during the verify phase. A first memory cell of the first WL layer is programmed before a second memory cell of the second WL layer. The first pass voltage is higher than a threshold voltage of a memory cell in a lowest programming state.

20 Claims, 6 Drawing Sheets

(56) References Cited

U.S. PATENT DOCUMENTS

| | | | |
|---|---|---|---|
| RE46,749 E | 3/2018 | Hosono | |
| 10,192,632 B2 | 1/2019 | Lee | |
| 10,236,064 B2 | 3/2019 | Lee | |
| 10,607,688 B2* | 3/2020 | Shin | G11C 11/4094 |
| 10,741,262 B2 | 8/2020 | Lin | |
| 11,908,532 B2* | 2/2024 | Kim | G11C 16/3459 |
| 11,923,018 B2* | 3/2024 | Jeong | G11C 11/5628 |
| 12,068,033 B2* | 8/2024 | Kim | G11C 16/3431 |
| 2007/0147113 A1* | 6/2007 | Mokhlesi | G11C 16/28 |
| | | | 365/185.21 |
| 2007/0211535 A1* | 9/2007 | Kim | G11C 11/4085 |
| | | | 365/185.21 |
| 2007/0247908 A1 | 10/2007 | Aritome | |
| 2008/0025097 A1 | 1/2008 | Aritome | |
| 2008/0049495 A1* | 2/2008 | Yamada | G11C 29/50004 |
| | | | 365/185.17 |
| 2009/0040833 A1 | 2/2009 | Shin | |
| 2009/0073771 A1 | 3/2009 | Li | |
| 2009/0316489 A1 | 12/2009 | Han | |
| 2010/0232234 A1 | 9/2010 | Damle | |
| 2012/0113720 A1* | 5/2012 | Kim | G11C 16/3445 |
| | | | 365/185.11 |
| 2012/0224429 A1 | 9/2012 | Moschiano | |
| 2012/0269001 A1 | 10/2012 | Ueno et al. | |
| 2013/0163326 A1 | 6/2013 | Lee | |
| 2013/0258771 A1 | 10/2013 | Lee | |
| 2013/0294155 A1* | 11/2013 | Chen | G11C 16/3427 |
| | | | 365/185.02 |
| 2014/0189257 A1 | 7/2014 | Aritome | |
| 2014/0198576 A1 | 7/2014 | Hung et al. | |
| 2014/0219032 A1 | 8/2014 | Moschiano | |
| 2014/0347921 A1 | 11/2014 | Shim | |
| 2014/0362643 A1 | 12/2014 | Yasuda et al. | |
| 2015/0078098 A1 | 3/2015 | Kwak | |
| 2015/0179235 A1 | 6/2015 | Nam | |
| 2015/0221375 A1 | 8/2015 | Choi | |
| 2015/0294726 A1 | 10/2015 | Sim | |
| 2016/0104540 A1 | 4/2016 | Lee | |
| 2016/0232965 A1* | 8/2016 | Lien | G11C 11/419 |
| 2016/0260732 A1 | 9/2016 | Lue | |
| 2017/0140814 A1* | 5/2017 | Puthenthermadam | G11C 16/08 |
| 2017/0278579 A1* | 9/2017 | Lee | G11C 16/28 |
| 2018/0012667 A1 | 1/2018 | Costa | |
| 2018/0033492 A1 | 2/2018 | Seo | |
| 2018/0102165 A1* | 4/2018 | Lien | G11C 11/419 |
| 2018/0240515 A1* | 8/2018 | Shibata | G11C 16/3459 |
| 2019/0019562 A1 | 1/2019 | Kim | |
| 2019/0147959 A1 | 5/2019 | Hsu | |
| 2019/0198117 A1 | 6/2019 | Yu et al. | |
| 2019/0318784 A1 | 10/2019 | Lee | |
| 2019/0355408 A1 | 11/2019 | Shin et al. | |
| 2019/0378580 A1 | 12/2019 | Zhao et al. | |
| 2020/0006379 A1 | 1/2020 | Nishikawa | |
| 2020/0143883 A1 | 5/2020 | Joo | |
| 2020/0174700 A1 | 6/2020 | Seong | |
| 2020/0202933 A1 | 6/2020 | Joo | |
| 2020/0202964 A1 | 6/2020 | Sako | |
| 2020/0211661 A1 | 7/2020 | Piccardi et al. | |
| 2020/0387313 A1 | 12/2020 | Lee et al. | |
| 2021/0005265 A1 | 1/2021 | Lee | |
| 2021/0027848 A1 | 1/2021 | Seo | |
| 2021/0082505 A1 | 3/2021 | Suzuki | |
| 2021/0118479 A1 | 4/2021 | Choi et al. | |
| 2021/0166765 A1 | 6/2021 | Dong et al. | |
| 2021/0193239 A1 | 6/2021 | Suzuki et al. | |
| 2021/0247932 A1 | 8/2021 | Lee | |
| 2021/0257038 A1 | 8/2021 | Hwang et al. | |
| 2021/0271605 A1 | 9/2021 | Hwang et al. | |

* cited by examiner

3D NAND FLASH AND OPERATION METHOD THEREOF

CROSS-REFERENCE TO RELATED APPLICATIONS

This is a continuation of U.S. application Ser. No. 17/751,432, filed on May 23, 2022, issued as U.S. Pat. No. 11,727,990, which is a continuation of U.S. application Ser. No. 17/199,411, filed on Mar. 11, 2021, issued as U.S. Pat. No. 11,342,023, which is a continuation of U.S. application Ser. No. 16/907,299, filed on Jun. 21, 2020, issued as U.S. Pat. No. 10,978,153, which is a continuation of International Application No. PCT/CN2020/090997, filed on May 19, 2020, all of which are incorporated herein by reference in their entireties.

BACKGROUND

The present disclosure relates to an operation method for 3D NAND flash and a 3D NAND flash, and more particularly, to an operation method for 3D NAND flash and a 3D NAND flash capable of reducing a write time and power consumption of the 3D NAND flash.

SUMMARY

The present disclosure provides an operation method for 3D NAND flash and a 3D NAND flash to reduce a write time and power consumption of the 3D NAND flash.

An embodiment of the present disclosure provides an operation method for a 3D NAND flash having a plurality of bit lines, wherein the plurality of bit lines includes a plurality of wordline (WL) layers, the operation method includes writing data into a WLn layer of the plurality of wordline layers of an unselect bit line of the plurality of bit lines according to a writing sequence from a first end of the plurality of wordline layers to a second end of the plurality of wordline layers in a write operation; and applying a first pass voltage on at least a first WL layer of the plurality of wordline layers of the unselect bit line of the plurality of bit lines and applying a second pass voltage on at least a second WL layer of the plurality of wordline layers of the unselect bit line of the plurality of bit lines; wherein the operation method is operated when a pre-pulse phase is removed from a verify phase.

Another embodiment of the present disclosure provides a 3D NAND flash, having a plurality of bit lines, wherein the plurality of bit lines includes a plurality of wordline (WL) layers, the 3D NAND flash includes a select bit line; at least an unselect bit line; and a controller, configured to write data into a WLn layer of the plurality of wordline layers of the at least an unselect bit line of the plurality of bit lines according to a writing sequence from a first end of the plurality of wordline layers to a second end of the plurality of wordline layers in a write operation, apply a first pass voltage on at least a first WL layer of the plurality of wordline layers of the at least an unselect bit line of the plurality of bit lines and apply a second pass voltage on at least a second WL layer of the plurality of wordline layers of the at least an unselect bit line of the plurality of bit lines; wherein data are written into the WLn layer according to a writing sequence from a first end of the plurality of wordline layers to a second end of the plurality of wordline layers in a write operation; wherein the operation method is operated when a pre-pulse phase is removed from a verify phase.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

In order to control threshold voltages in a write operation and implement storage of multiple data of a NAND flash memory, increment step pulse program (ISPP) technique is widely adopted. The ISPP technique is configured to interleave with program verify phases of the threshold voltage between two programming operations. Memory cells of the NAND flash memory, which pass the program verify phase, are performed inhibit program; memory cells of the NAND flash memory, which do not pass the program verify phase, are preceded to the ISPP technique. The ISPP technique includes a pre-charge phase and a programming phase, wherein the pre-charge phase enhances a coupling potential of channels and reduces programming interference. The program verify phases usually include a pre-pulse phase, a read phase and a pre-cutoff phase, wherein the pre-pulse phase and the pre-cutoff phase are utilized for reducing injection of electrons.

For a 3D NAND flash memory with vertical channel, in order to prevent leakage interference of voltage from unselect strings in the program verify phases, upper select gates of unselect strings are usually cutting off and lower select gates of the unselect stings are turned on and shared. However, for an unselect string, when a memory cell corresponding to a wordline WLn of the unselect string is in a programming phase, the wordline WLn is a select wordline and is verified by a verify voltage. When the verify voltage is smaller than a threshold voltage of the memory cell, the unselect strings of the select memory cell are turned off, a difference of channel potential between the wordline WLn and a wordline WLn+1 occurs, and interference is generated due to electron injection of the wordline WLn+1. A conventional solution to the above issue is adding the pre-pulse phase before the verify phase, but a writing time is thereby increased. Therefore, improvements are necessary to the prior arts.

Figure 1:
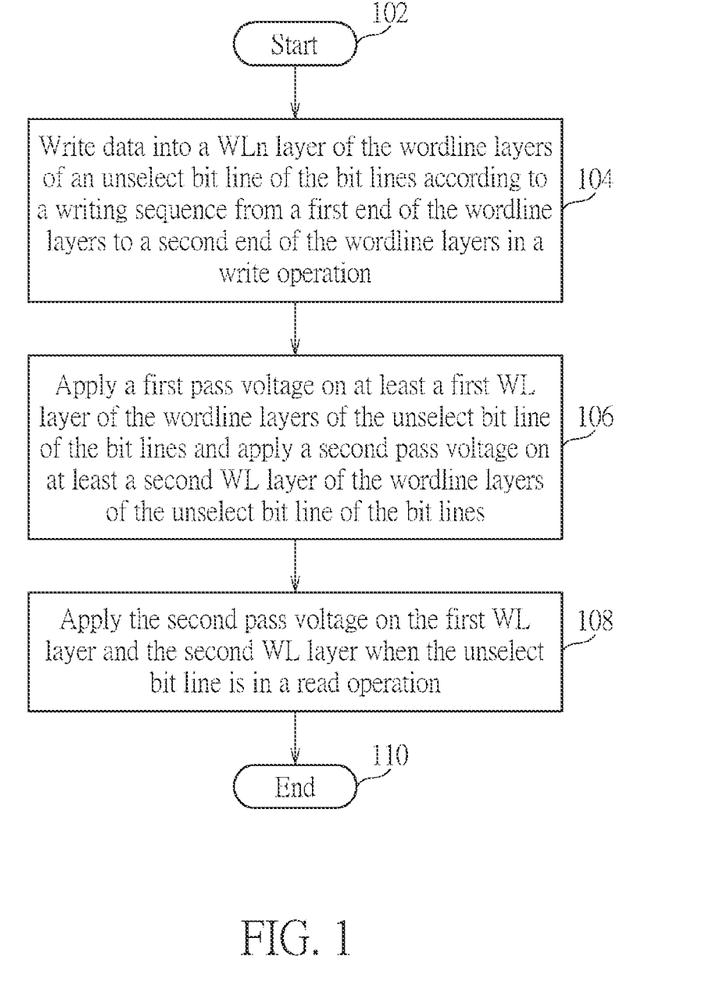
FIG. 1 is a schematic diagram of an operation process for a 3D NAND flash according to an embodiment of the present disclosure.

In order to reduce a write time of 3D NAND flash, a pre-pulse phase is removed from program verify phases. That is, there is no pre-pulse phase during or before the verify phase. FIG. 1 is a schematic diagram of an operation process 10 for a 3D NAND flash according to an embodiment of the present disclosure. The 3D NAND flash may include a plurality of bit lines, wherein the bit lines comprise a plurality of wordline (WL) layers. The operation process 10 for the 3D NAND flash includes the following steps:

Step 102: Start.

Step 104: Write data into a WLn layer of the wordline layers according to a writing sequence from a first end of the wordline layers to a second end of the wordline layers in a write operation.

Step 106: Apply a first pass voltage on at least a first WL layer of the wordline layers and apply a second pass voltage on at least a second WL layer of the wordline layers.

Step 108: Apply the second pass voltage on the first WL layer and the second WL layer when the unselect bit line is in a read operation.

Step 110: End.

Figure 2:
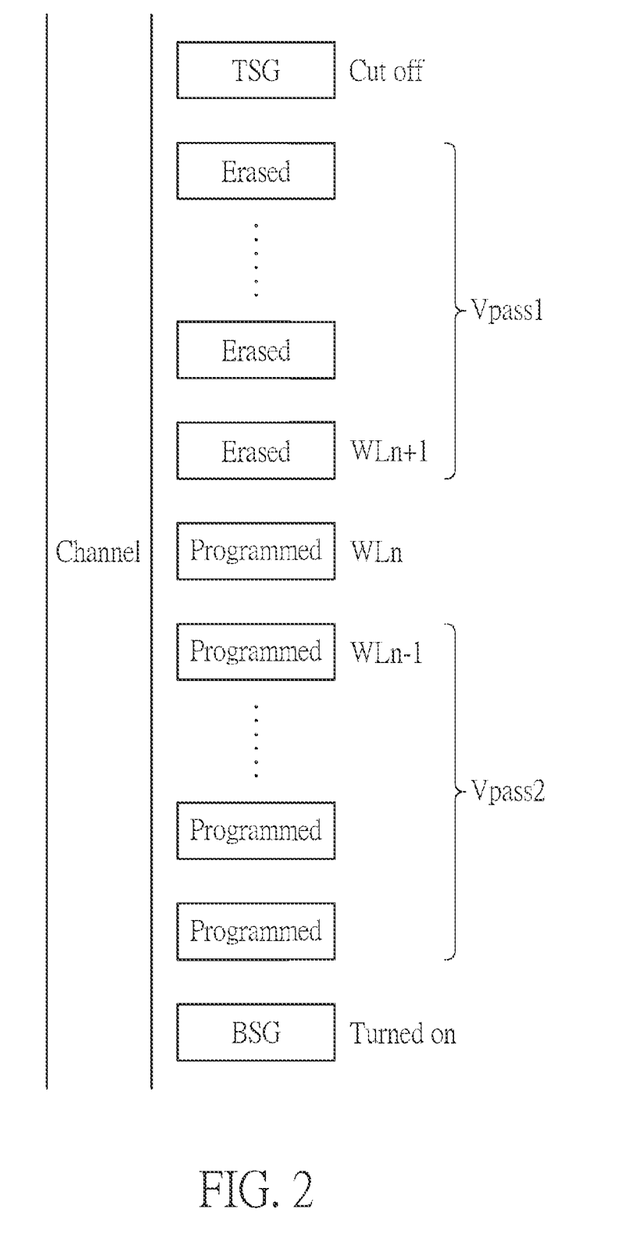
FIG. 2 is a schematic diagram of an unselect bit line of the 3D NAND flash applying the operation process according to an embodiment of the present disclosure.

To explain the operation process 10, please also refer to FIG. 2, which is a schematic diagram of a 3D NAND flash applying the operation process 10 according to an embodiment of the present disclosure. The operation process 10 may be executed by a controller (not illustrated in the drawings) of the 3D NAND flash. As shown in FIG. 2, includes a top select gate TSG, the first wordline layers, the WLn layer, the second wordline layers and a bottom select gate BSG.

Since the write operation of the 3D NAND flash may be started from one end of the top select gate TSG or the bottom select gate BSG, in an embodiment, the data is written from the bottom select gate BSG to the top select gate TSG, but is not limited thereto. The write operation of the 3D NAND flash may be started from the top select gate TSG to the bottom select gate BSG in other embodiments.

According to the operation process 10, in step 104, in the write operation of the 3D NAND flash, the data are written respectively into the layers of the 3D NAND flash according to the writing sequence. In an embodiment, when the data are written into the WLn layer of the wordline layers, i.e. the WLn layer is a current layer. The second WL layers are layers in an erased state between the top select gate TSG and the WLn layer of the wordline layers, and the first WL layers are programmed between the WLn layer and the bottom select gate BSG of the wordline layers.

In step 106, a first pass voltage Vpass1 is applied on the first WL layers of the wordline layers, and a second pass voltage Vpass2 is applied on the second WL layers of the wordline layers. In an embodiment, the first pass voltage Vpass1 is higher than a minimal program-verify level of the 3D NAND flash in a verify phase, which is 1 to 2 volts higher than a minimal distribution of program-verify level of the 3D NAND flash. For example, when the 3D NAND flash is a multi-level cell (MLC) 3D NAND flash, which includes four states corresponding to bit codes 11, 10, 01, 00, i.e., programmed states P0, P1, P2, P3, wherein the programmed state P0 is the minimal distribution of program-verify level. In this example, the first pass voltage Vpass1 is 1 to 2 volts higher than the programmed state P0. In addition, the second pass voltage Vpass2 is larger than a maximal program-verify level of the 3D NAND flash to turn on a channel of a corresponding bit line. That is, the second pass voltage Vpass2 is larger than the programmed state P3 when the 3D NAND flash is the MLC 3D NAND flash.

In an embodiment, the verify phase is performed after the data are written into the WLn layers. In other words, after the WLn layer is programmed, the verify phase is performed on the WLn layer to verify the WLn layer by increment step pulse program (ISPP) technique with threshold voltages corresponding to the program-verify levels. Since the first pass voltage Vpass1 is lower than the second pass voltage Vpass2, a difference of channel potential between the WLn layer and the WLn+1 layer is reduced when the pre-pulse phase is removed from the verify phase. In addition, interference generated by electron injection from the WLn+1 layer to the WLn layer is reduced accordingly.

Notably, in the verify phase of the write operation according to the operation process 10, the top select gate TSG is turned off and the bottom select gate BSG is turned on, such that the bottom select gate BSG is shared with other bit lines. Alternatively, the bottom select gate BSG may be turned off to reduce the difference of channel potential in other embodiments.

Figure 3:
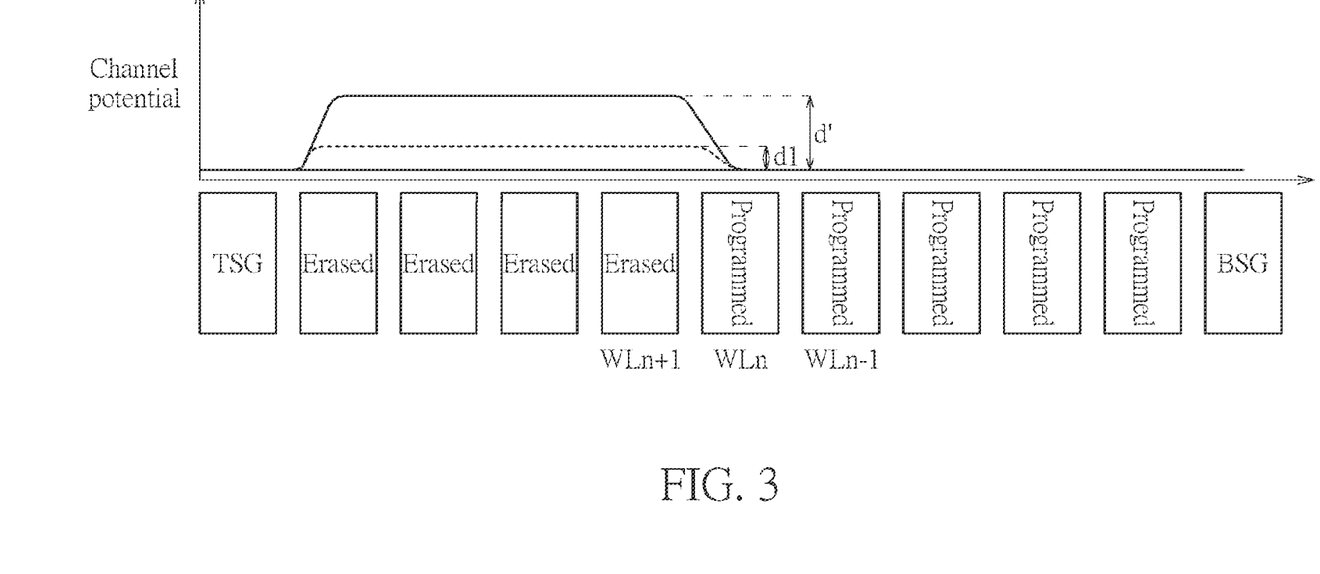
FIG. 3 is a schematic diagram of a distribution of channel potential of the unselect bit line of the 3D NAND flash according to an embodiment of the present disclosure.

FIG. 3 is a schematic diagram of a distribution of the channel potential of the unselect bit line of the 3D NAND flash according to an embodiment of the present disclosure.

As shown in FIG. 3, the difference dl of channel potential between the WLn+1 layer of the first WL layers and the WLn layer applying the operation process 10 is reduced in comparison to a difference d' of channel potential between the WLn+1 layer of the first WL layers and the WLn layer in the prior art.

Figure 4:
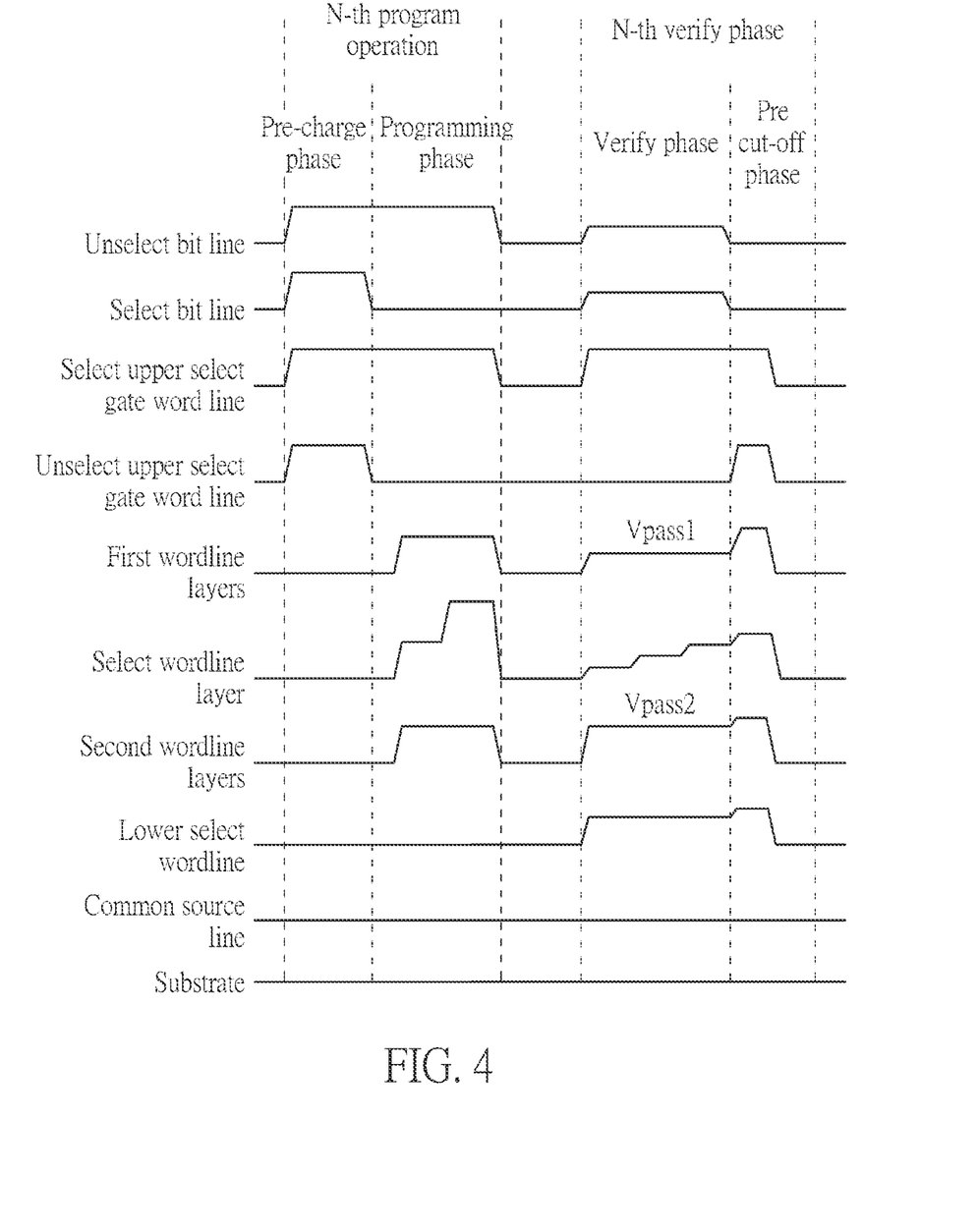
FIG. 4 is a waveform diagram of the unselect bit string of the 3D NAND flash applying the operation process according to an embodiment of the present disclosure.

FIG. 4 is a waveform diagram of the unselect bit string of the 3D NAND flash applying the operation process 10 according to an embodiment of the present disclosure. As shown in FIG. 4, the unselect bit string includes an unselect bit line, a select bit line, a select upper select gate word line, the first wordline layers, a select wordline (i.e., the WLn layer), the second wordline layers, a lower select wordline, a common source line and a substrate. In FIG. 4, after an N-th program operation, which includes a pre-charge phase and a programming phase, an N-th verify phase, which includes the verify phase and a pre cut-off phase, is performed. Since the pre-pulse phase is removed from the verify phase according to the operation process 10, in the verify phase, the first wordline layers are applied with the first pass voltage Vpass1, the second wordline layers are applied with the second pass voltage Vpass2, and the select wordline (i.e., the WLn layer) is applied with different threshold voltages for verify phase.

Figure 5:
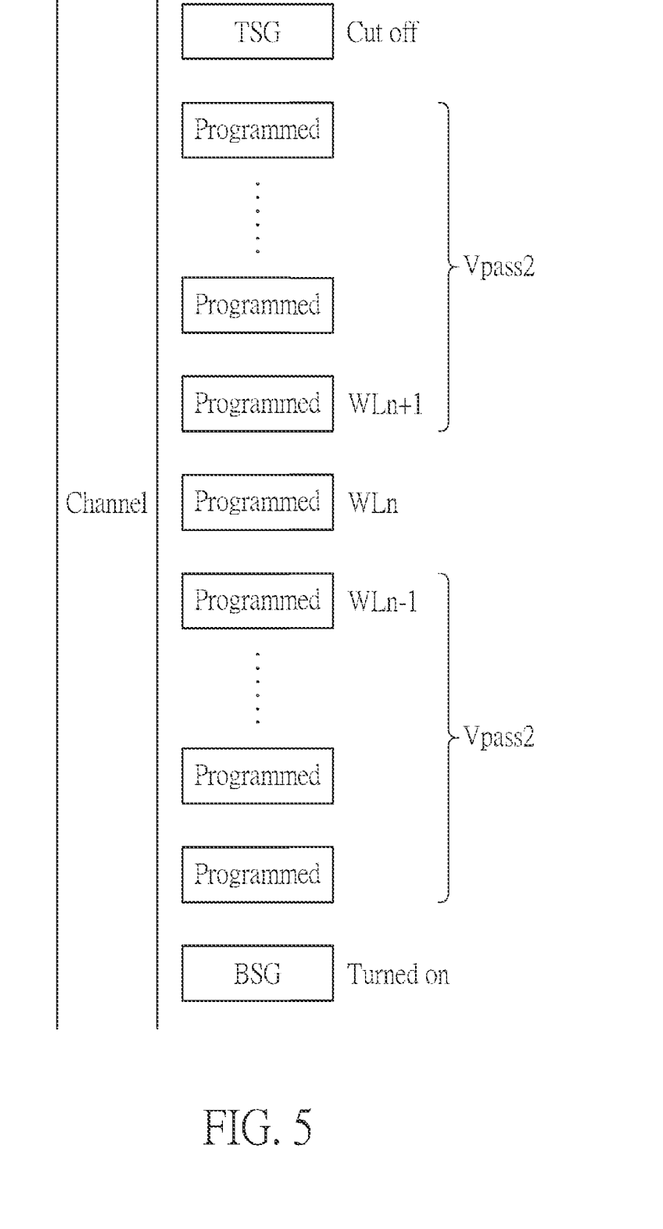
FIG. 5 is a schematic diagram of the unselect bit line of the 3D NAND flash in the read operation applying the operation process according to an embodiment of the present disclosure.

Referring to a read operation of the operation process 10, in step 108, the second pass voltage Vpass2 is applied on the first WL layers and the second WL layers. Please refer to FIG. 5 simultaneously, which is a schematic diagram of the unselect bit line of the 3D NAND flash in the read operation applying the operation process 10 according to an embodiment of the present disclosure.

Figure 6:
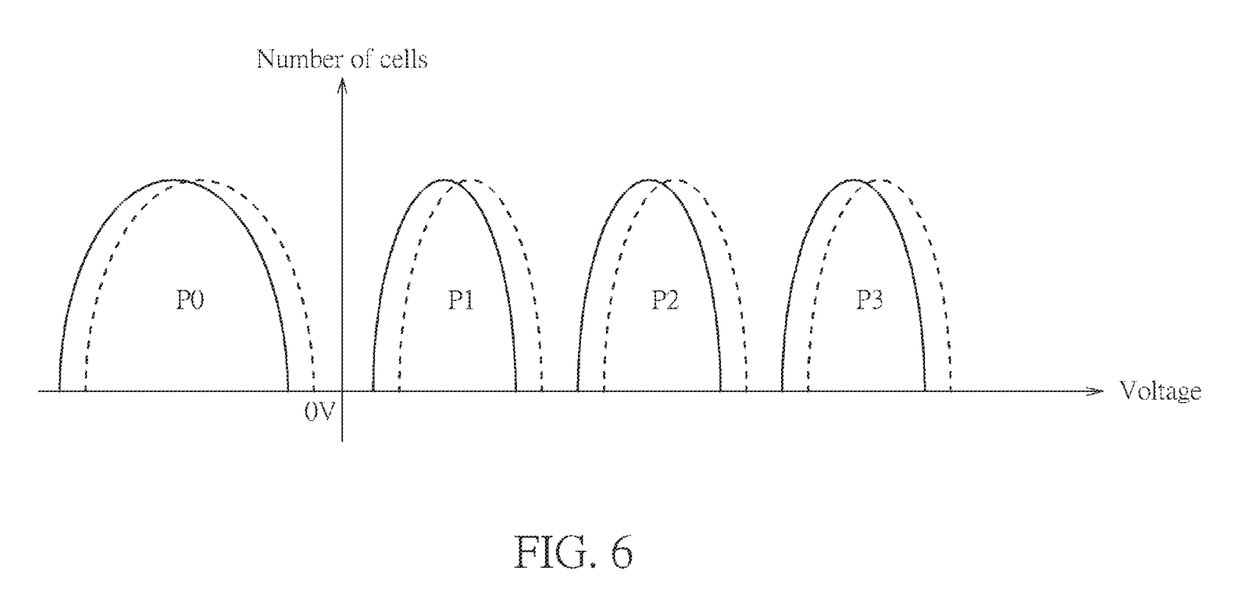
FIG. 6 is a schematic diagram of a distribution shift of program-verify level applying the operation process according to an embodiment of the present disclosure.

After the data are written into corresponding memory cell of the 3D NAND flash, the first WL layers should be applied with the voltage as same as the second WL layers, i.e., the second pass voltage Vpass2. Since the first WL layers and the second WL layers are respectively applied with the first pass voltage Vpass1 and the second pass voltage Vpass2 in the write operation, a distribution shift of program-verify level of the 3D NAND flash in the read operation is generated. As shown in FIG. 6, dash lines represent the distributions of program-verify level in the write operation and solid lines represent the distributions of program-verify levels in the read operation. As such, the threshold voltages corresponding to different program-verify levels in the read operation are lower than the threshold voltages corresponding to different program-verify levels in the write operation, verify voltages corresponding to the distributions of program-verify levels, i.e. the programmed states P0, P1, P2, P3, are increased to compensate the distribution difference of program-verify levels between the write operation and the read operation.

Therefore, the first WL layers of the wordline layers are applied with the first pass voltage Vpass1 and the second WL layers of the wordline layers are applied with the second pass voltage Vpass2 to reduce the difference of channel potential between the WLn layer and the WLn+1 layer of the first WL layers when the pre-pulse phase is removed from the verify phase, wherein the first pass voltage Vpass1 is lower than the second pass voltage Vpass2, since the electron injection from the WLn+1 layer to the WLn layer is reduced.

Notably, the embodiments stated above illustrate the concept of the present disclosure, those skilled in the art may make proper modifications accordingly, and not limited thereto.

In summary, the present disclosure provides an operation method for 3D NAND flash and a 3D NAND flash, which reduces the electron injection in tunnel to reduce a write time and power consumption of the 3D NAND flash.

Those skilled in the art will readily observe that numerous modifications and alterations of the device and method may be made while retaining the teachings of the disclosure. Accordingly, the above disclosure should be construed as limited only by the metes and bounds of the appended claims.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory, comprising:
   wordline (WL) layers; and
   a controller, coupled to the WL layers, and configured to:
   apply at least one verify voltage to a first WL layer of the WL layers during a verify phase of a program-verify operation;
   apply a first pass voltage to a second WL layer of the WL layers during at least a part of the verify phase; and
   apply a second pass voltage to a third WL layer of the WL layers during the verify phase;
   wherein a first memory cell of the first WL layer is programmed before a second memory cell of the second WL layer;
   a third memory cell of the third WL layer is programmed before the first memory cell of the first WL layer; and
   the first pass voltage is higher than a threshold voltage of a memory cell in a lowest programming state and less than the second pass voltage.

2. The memory of claim 1, wherein the first pass voltage is at least 1 volt higher than the threshold voltage of the memory cell in the lowest programming state.

3. The memory of claim 2, wherein the first pass voltage is 1 volt to 2 volts higher than the threshold voltage of the memory cell in the lowest programming state.

4. The memory of claim 1, wherein the first pass voltage is higher than a minimal program-verify level in the verify phase and lower than a maximal program-verify level.

5. The memory of claim 1, wherein the controller is further configured to perform a write operation of the program-verify operation and the verify phase without a pre-pulse phase.

6. The memory of claim 1, wherein
   the controller is further configured to program memory cells coupled to the WL layers according to a writing sequence from a first end of the WL layers to a second end of the WL layers in a write operation of the program-verify operation;
   the first WL layer is a WLn layer of the WL layers that is selected in the verify phase;
   the second WL layer is between a WLn+1 layer and the second end, and the WLn+1 layer is adjacent to the WLn layer and between the WLn layer and the second end; and
   the third WL layer is between a WLn−1 layer and the first end, and the WLn−1 layer is adjacent to the WLn layer and between the WLn layer and the first end.

7. A memory, comprising:
   wordline (WL) layers; and a controller, coupled to the WL layers and configured to:
apply at least one verify voltage to a WLn layer of the WL layers during a verify phase of a program-verify operation;
apply a first pass voltage to a WLn+x layer of the WL layers during the verify phase, wherein a first memory cell of the WLn layer is programmed before a second memory cell of the WLn+x layer, and x is an integer larger than 1; and
apply a second pass voltage to a WLn−y layer of the WL layers during the verify phase,
wherein a third memory cell of the WLn−y layer is programmed before the first memory cell of the WLn layer, and y is an integer larger than 1; and
the first pass voltage is less than the second pass voltage.

8. The memory of claim 7, wherein the first pass voltage is higher than a minimal program-verify level in the verify phase and lower than a maximal program-verify level.

9. The memory of claim 7, wherein the controller is further configured to perform a write operation of the program-verify operation and the verify phase without a pre-pulse phase.

10. A method of operating a memory comprising wordline (WL) layers, the method comprising:
applying at least one verify voltage to a first WL layer of the WL layers during a verify phase of a program-verify operation;
applying a first pass voltage to a second WL layer of the WL layers during at least a part of the verify phase; and
applying a second pass voltage to a third WL layer of the WL layers during the verify phase,
wherein a first memory cell coupled to the first WL layer is programmed before a second memory cell coupled to the second WL layer;
a third memory cell of the third WL layer is programmed before the first memory cell of the first WL layer; and
the first pass voltage is higher than a threshold voltage of a memory cell in a lowest programming state and less than the second pass voltage.

11. The method of claim 10, wherein the first pass voltage is higher than a minimal program-verify level in the verify phase and lower than a maximal program-verify level.

12. The memory of claim 4, wherein the second WL layer is adjacent to the first WL layer.

13. The memory of claim 12, wherein the controller is further configured to:
apply a plurality of verify voltages to the first WL layer during the verify phase; and
apply the first pass voltage to the second WL layer when applying a first one of the plurality of verify voltages to the first WL layer.

14. The memory of claim 4, wherein the controller is further configured to apply a programming voltage to the first WL layer during a programming phase of the program-verify operation; and
no pre-pulse is applied to at least one unselect upper select gate word line between the programming phase and the verify phase.

15. The memory of claim 4, wherein a voltage of at least one unselect upper select gate word line remains constant during a period from a programming phase of the program-verify operation to the verify phase.

16. The memory of claim 8, wherein the controller is further configured to apply the first pass voltage to all WL layers between WLn+x and a select gate word line during the verify phase.

17. The method of claim 10, wherein the second WL layer is adjacent to the first WL layer.

18. The method of claim 17, further comprising:
applying a plurality of verify voltages to the first WL layer during the verify phase; and
applying the first pass voltage to the second WL layer when applying a first one of the plurality of verify voltages to the first WL layer.

19. The method of claim 10, further comprising:
applying a programming voltage to the first WL layer during a programming phase of the program-verify operation, wherein no pre-pulse is applied to at least one unselect upper select gate word line between the programming phase and the verify phase.

20. The method of claim 10, wherein a voltage of at least one unselect upper select gate word line remains constant during a period from a programming phase of the program-verify operation to the verify phase.

* * * * *